(12) United States Patent
Hojabri et al.

(10) Patent No.: US 9,964,576 B2
(45) Date of Patent: May 8, 2018

(54) CAPACITANCE DETECTION CIRCUIT THAT DETECTS MINUTE CHANGES IN CAPACITANCE

(71) Applicant: Texas Instruments Incorporated, Dallas, TX (US)

(72) Inventors: Peyman Hojabri, San Jose, CA (US); Charles Yong Yi Guan, Pleasanton, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days. days.

(21) Appl. No.: 14/507,665

(22) Filed: Oct. 6, 2014

(65) Prior Publication Data

US 2015/0097577 A1 Apr. 9, 2015

Related U.S. Application Data

(60) Provisional application No. 61/889,939, filed on Oct. 9, 2013.

(51) Int. Cl.
*G01R 27/26* (2006.01)
*G01R 35/00* (2006.01)

(52) U.S. Cl.
CPC .............................. *G01R 27/2605* (2013.01)

(58) Field of Classification Search
CPC ....................................... G01R 27/26–27/2605
USPC .................................................. 324/658–690
See application file for complete search history.

(56) References Cited

U.S. PATENT DOCUMENTS

| 6,777,958 | B2 * | 8/2004 | Haag | H03K 17/955 |
| | | | | 324/519 |
| 7,119,550 | B2 | 10/2006 | Kitano et al. | |
| 7,902,840 | B2 * | 3/2011 | Zachut | A63F 3/00643 |
| | | | | 324/663 |
| 8,825,158 | B2 * | 9/2014 | Swerdlow | A61N 1/3706 |
| | | | | 607/27 |
| 2010/0332170 | A1 * | 12/2010 | Gao | G01N 27/228 |
| | | | | 702/65 |

* cited by examiner

*Primary Examiner* — Melissa Koval
*Assistant Examiner* — Rahul Maini
(74) *Attorney, Agent, or Firm* — Andrew Viger; Charles A. Brill; Frank D. Cimino

(57) ABSTRACT

A capacitance detection circuit detects changes in the capacitance of a variable capacitor by using the change in capacitance to change the resonant frequency of a variable capacitor oscillator. The resonant frequency of the variable capacitor oscillator is converted from the time domain to the frequency domain, and then selected frequencies values are compared to known frequency domain values to detect the magnitude of the change in capacitance.

18 Claims, 3 Drawing Sheets

CAPACITANCE DETECTION CIRCUIT THAT DETECTS MINUTE CHANGES IN CAPACITANCE

This application claims benefit from Provisional Application No. 61/888,939 filed on Oct. 9, 2013 for Peyman Hojabri et al.

BACKGROUND OF THE INVENTION

1. Field of the Invention

The present invention relates to capacitance detection circuits and, more particularly, to a capacitance detection circuit that detects minute changes in capacitance.

2. Description of the Related Art

A variable capacitor is a well-known circuit element whose capacitance, as the name implies, can vary. Variable capacitors are commonly used as a point of control where a control signal is used to set or change the capacitance. For example, a control signal can be used to set or change the capacitance of a variable capacitor in a LC circuit which, in turn, sets or changes the resonant frequency generated by the LC circuit.

Variable capacitors are also commonly used as a sensor where the change in capacitance occurs as a result of a change in an external physical condition. For example, a variable capacitor can be formed in a micro-electromechanical system (MEMS) integrated circuit where the change in capacitance occurs as a result of a change in acceleration, pressure, or some other external physical condition.

A MEMS integrated circuit is a semiconductor structure that is fabricated using the same types of steps (e.g., the deposition of layers of material and the selective removal of the layers of material) that are used to fabricate conventional analog and digital CMOS circuits. MEMS integrated circuits differ from conventional integrated circuits in that MEMS integrated circuits include movable micro-structures.

One example of a movable micro-structure is a thin plate structure that is formed over a cavity where the thin plate structure physically moves in and out of the cavity when the MEMS integrated circuit is subjected to an external physical condition. For example, when the MEMS integrated circuit (which is connected to some other body) accelerates, the thin plate structure moves in response to the acceleration.

The thin plate structure and cavity can be utilized to form a variable capacitor by forming a first electrode on the thin plate structure and a second electrode on, for example, the bottom of the cavity. In operation, the capacitance of the MEMS variable capacitor changes as the plate structure moves and the distance between the first and second electrodes of the capacitor changes.

In a MEMS integrated circuit, both surfaces of a plate structure can be used to support electrodes. For example, the first electrode of one capacitor can be formed on the top surface of the plate structure, while the first electrode of another capacitor can be formed on the bottom surface of the plate structure.

Regardless of how a variable capacitor is used, it can be difficult to detect the change in capacitance. When used as a point of control, it can be difficult to determine whether the control signal actually produced the desired capacitance or change in capacitance. Age, temperature, and other factors can cause the actual capacitance to differ from the desired capacitance.

When used as a sensor, it can be difficult to detect minute changes in capacitance and, thereby, minute changes in the external physical condition. Thus, there is a need for an approach to detecting changes in capacitance.

SUMMARY OF THE INVENTION

The present invention provides a capacitance detection circuit that detects changes in the capacitance of a variable capacitor. A capacitance detection circuit of the present invention includes a frequency clean-up and digitization circuit that receives an oscillating signal, and outputs a series of digital values that represent a portion of the oscillating signal. The capacitance detection circuit also includes a frequency decomposition circuit connected to the frequency clean-up and digitization circuit. The frequency decomposition circuit evaluates each digital value in the series of digital values, and determines a number of frequencies and frequency magnitudes that are present in each digital value.

A capacitance detection circuit of an alternate embodiment of the present invention includes a frequency clean-up and digitization circuit that receives a first oscillating signal and a second oscillating signal, outputs a series of first digital values that represent a portion of the first oscillating signal, and outputs a series of second digital values that represent a portion of the second oscillating signal. The capacitance detection circuit also includes a frequency decomposition circuit that is connected to the frequency clean-up and digitization circuit. The frequency decomposition circuit evaluates each first digital value in the series of first digital values, determines a number of frequencies and frequency magnitudes that are present in each first digital value, evaluates each second digital value in the series of second digital values, and determines a number of frequencies and frequency magnitudes that are present in each second digital value.

A better understanding of the features and advantages of the present invention will be obtained by reference to the following detailed description and accompanying drawings which set forth an illustrative embodiment in which the principals of the invention are utilized.

DETAILED DESCRIPTION OF THE INVENTION

Figure 1:
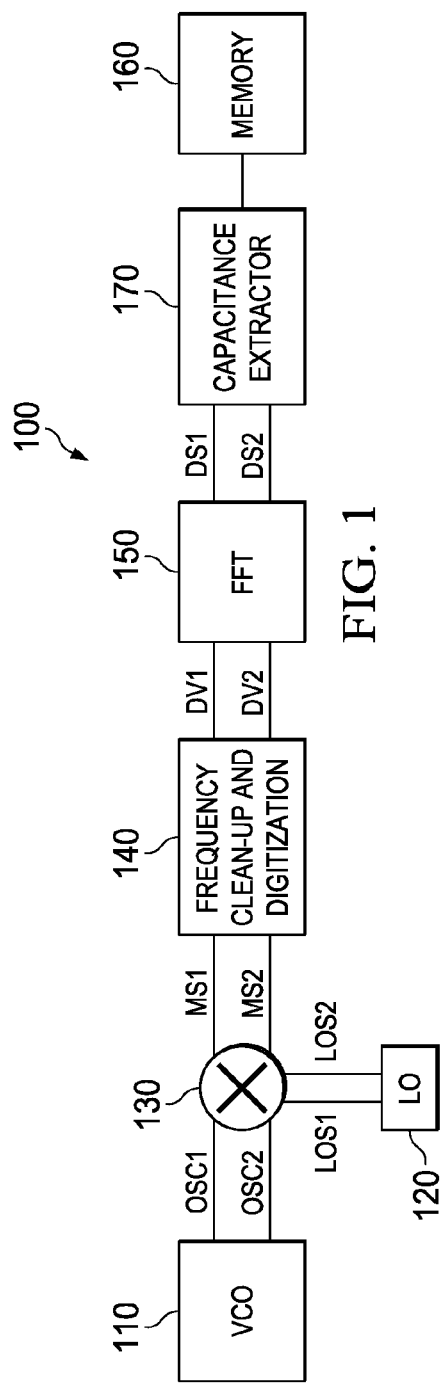
FIG. 1 is a block diagram illustrating an example of a capacitance detection circuit 100 in accordance with the present invention.

FIG. 1 shows a block diagram that illustrates an example of a capacitance detection circuit 100 in accordance with the present invention. As described in greater detail below, capacitance detection circuit 100 changes the resonant frequency of an oscillator in response to changes in the capacitance of a variable capacitor, converts the resonant frequency from the time domain to the frequency domain, and then compares selected frequencies values to known frequency domain values to detect the magnitude of the change in capacitance.

As shown in FIG. 1, capacitance detection circuit 100 includes a variable capacitance oscillator (VCO) 110 that generates a number of oscillator signals OSC. VCO 110 has a number of inductors and a corresponding number of variable capacitors that are connected to the inductors. The oscillator signals OSC have resonant frequencies that change in response to changes in the capacitances of the variable capacitors. In the present example, VCO 110 generates two oscillator signals OSC1 and OSC2.

Figure 2:
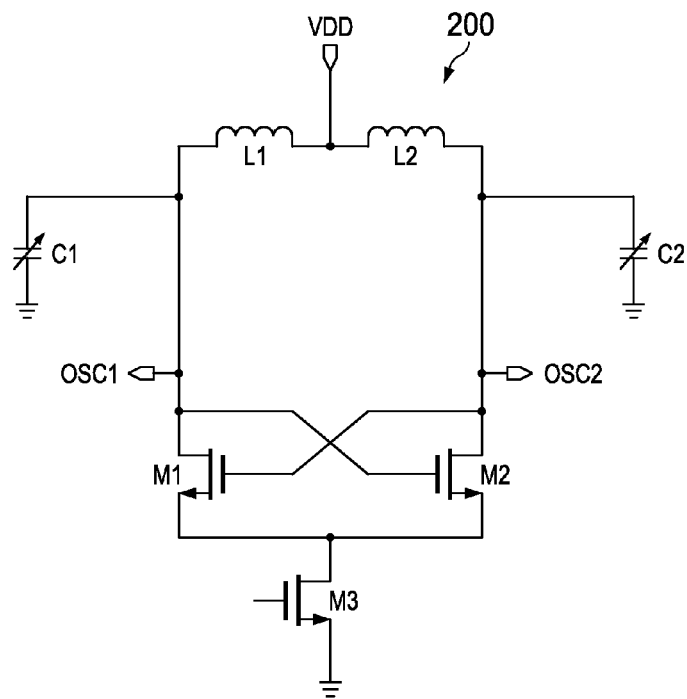
FIG. 2 is a circuit diagram illustrating an example of a VCO 200 in accordance with the present invention.

FIG. 2 shows a circuit diagram that illustrates an example of a VCO 200 in accordance with the present invention. VCO 200 can be utilized to implement VCO 110. As shown in FIG. 2, VCO 200 includes an inductor L1 and an inductor L2 that are connected to a DC voltage supply VDD. Further, VCO 200 also includes a variable capacitor C1 that is connected to inductor L1, and a variable capacitor C2 that is connected to inductor L2.

The variable capacitors C1 and C2 can be implemented in a number of different ways, such as discrete capacitors or semiconductor capacitors. In the present example, the variable capacitors C1 and C2 are formed within a MEMS integrated circuit as a sensor that detects changes in an external physical condition. There are many conventional examples of a MEMS integrated circuit with variable capacitors used as sensors.

As further shown in FIG. 2, VCO 200 also includes an NMOS transistor M1, an NMOS transistor M2, and an NMOS transistor M3. Transistor M1 has a gate connected to inductor L2 and capacitor C2, a drain connected to inductor L1 and capacitor C1, and a source. Transistor M2 has a gate connected to inductor L1 and capacitor C1, a drain connected to inductor L2 and capacitor C2, and a source. Transistor M3, which functions as a current source, has a gate, a drain connected to the sources of transistors M1 and M2, and a source connected to ground.

In operation, when VCO 200 is first powered up, the DC voltage VDD is applied across inductor L1. However, no current initially flows through inductor L1 because the current through an inductor cannot change instantaneously. As a result, no current initially flows into capacitor C1.

After the initial power up, a current gradually begins to flow through inductor L1 in response to the DC voltage across inductor L1. The current creates a magnetic field around inductor L1 and charges up the voltage on capacitor C1. The current reaches a maximum as the voltage on capacitor C1 becomes equal to the DC supply voltage VDD.

When the voltage on capacitor C1 becomes equal to the DC supply voltage VDD, there is no longer any voltage across inductor L1. At this point, the magnetic field around inductor L1 begins to collapse. The collapsing magnetic field releases the energy stored in the magnetic field, and causes a current to continue to flow in the same direction.

The current from the collapsing magnetic field continues to charge up capacitor C1, and gradually decreases as the magnetic field collapses. The current stops when the magnetic field collapses completely, at which time capacitor C1 has been charged up to a voltage that is equal to twice the DC supply voltage VDD.

The process then reverses itself, with capacitor C1 sourcing a current that begins to flow through inductor L1 in the opposite direction. The current discharges the voltage on capacitor C1 while creating a magnetic field (with opposite polarity) around inductor L1. The current gradually increases and reaches a maximum as the voltage on capacitor C1 again becomes equal to the DC supply voltage VDD.

When the voltage on capacitor C1 becomes equal to the DC supply voltage VDD, there is no longer any voltage across inductor L1. At this point, the magnetic field around inductor L1 begins to collapse. The collapsing magnetic field releases the energy stored in the magnetic field, and causes a current to continue to flow in the same direction.

The current from the collapsing magnetic field continues to discharge capacitor C1, and gradually decreases as the magnetic field collapses. The current from capacitor C1 stops when the magnetic field collapses completely, at which time capacitor C1 has been completely discharged.

The charging and discharging of capacitor C1 generates the oscillator signal OSC1, which is a sinusoidal waveform that oscillates at a resonant frequency $f_{RES}$ that is defined by equation EQ. 1:

$$f_{RES}=1/(2\pi \operatorname{sqrt}(LC)). \quad \text{EQ. 1}$$

Inductor L2 and capacitor C2 operate in the same manner to generate the oscillator signal OSC2, which is also a sinusoidal waveform that oscillates at the resonant frequency $f_{RES}$ that is defined by equation EQ. 1.

The resonant frequency of an oscillator signal changes when the capacitance of a variable capacitor changes because it now takes a shorter or a longer period of time for the variable capacitor to charge up. In the present example, when the MEMS integrated circuit is subjected to an external movement, the capacitances of the variable capacitors C1 and C2 change which causes the resonant frequencies of the oscillator signals OSC1 and OSC2 to change.

An ideal VCO oscillating at the resonant frequency is lossless, alternately storing the energy in the inductor and capacitor. Real world VCOs, however, are not lossless, but continuously lose a small amount of energy due to the resistance associated with inductor L1, the losses of capacitor C1, the wires that connect inductor L1 and capacitor C1 together, and the eddy current losses from the magnetic field. Thus, a small amount of additional maintenance energy must be provided to the VCO to overcome the losses and maintain a steady oscillation.

In VCO 200, the NMOS transistors M1 and M2, which are cross-coupled, gradually turn on and turn off as the voltages of the oscillating signals OSC1 and OSC2 rise above and fall below the gate-to-source voltages of the NMOS transistors M1 and M2, thereby providing the small amount of additional energy required to maintain a steady oscillation.

Referring again to FIG. 1, capacitance detection circuit 100 also includes a local oscillator (LO) 120 and a mixer 130 that is connected to VCO 110 and LO 120. LO 120 outputs a local oscillator signal LOS1 with a frequency that is equal to one of the resonant frequencies of the oscillator signal OSC1, and a local oscillator signal LOS2 with a frequency that is equal to one of the resonant frequencies of the oscillator signal OSC2.

In the present example, the frequency of the local oscillator signal LOS1 is equal to the resonant frequency of the oscillator signal OSC1 when the MEMS integrated circuit is stationary and the capacitance is constant. Similarly, the frequency of the local oscillator signal LOS2 is equal to the resonant frequency of the oscillator signal OSC2 when the MEMS integrated circuit is stationary and the capacitance is constant.

Mixer 130 mixes the oscillator signal OSC1 with the local oscillator signal LOS1 in a conventional manner, and generates a mixed signal MS1 in response. Mixer 130 also mixes the oscillator signal OSC2 with the local oscillator signal LOS2 in a conventional manner, and generates a mixed signal MS2 in response. The mixed signals MS1 and MS2 are oscillating signals.

As additionally shown in FIG. 1, capacitance detection circuit 100 includes a frequency clean-up and digitization circuit 140 that is connected to mixer 130. Frequency clean-up and digitization circuit 140 receives the mixed signals MS1 and MS2, and outputs a series of first digital values DV1 that represent a portion of mixed signal MS1, and a series of second digital values DV2 that represent a portion of mixed signal MS2.

For example, frequency clean-up and digitization circuit 140 can remove unwanted frequencies from the mixed signal MS1 to leave a portion of mixed signal MS1, and then sample and digitize the portion of mixed signal MS1 to generate the series of first digital values DV1. Frequency clean-up and digitization circuit 140 can also remove unwanted frequencies from the mixed signal MS2 to leave a portion of mixed signal MS2, and then sample and digitize the portion of mixed signal MS2 to generate the series of second digital values DV2. Effectively, frequency clean-up and digitization circuit 140 samples and digitizes the analog frequency of the modulated mixed signals MS1/MS2 with a predetermined resolution.

Frequency clean-up and digitization circuit 140 can be implemented in a number of different ways. For example, if the f1-f2 down-converted frequency, the first harmonic of the f1-f2 down-converted frequency, and the frequencies between these frequencies are the only frequencies of interest in the mixed signal MS1, then a conventional band pass filter can be utilized to remove the frequencies below the f1-f2 down-converted frequency, and above the first harmonic. A conventional analog-to-digital (A/D) converter can next be used to digitize the output from the band pass filter. A conventional band pass filter and an A/D converter can also be used with the mixed signal MS2.

Alternately, the mixed signal MS1 can be digitized with a conventional A/D converter, and then filtered using a conventional digital filter to generate the series of first digital values DV1. A conventional A/D converter can also be used to digitize the mixed signal MS2, followed by a conventional digital filter to generate the series of second digital values DV2. The mixed signals MS1 and MS2 can each alternately be filtered and digitized by a Sigma Delta ADC, which combines the filtering and analog-to-digital conversion circuitry.

As further shown in FIG. 1, capacitance detection circuit 100 includes a frequency decomposition circuit 150 that is connected to frequency clean-up and digitization circuit 140. Frequency decomposition circuit 150 evaluates each first digital value DV1 in the series of first digital values DV1, determines the frequencies and frequency magnitudes that are present in each first digital value DV1 (which is a digitized sample of a filtered version of mixed signal MS1), and outputs the frequencies and frequency magnitudes in each first digital value DV1 as a first data set DS1. Thus, frequency decomposition circuit 150 receives the series of first digital values DV1, and outputs a series of first data sets DS1 in response where each first data set DS1 identifies the frequencies and frequency magnitudes that are present in a corresponding first digital value DV1.

In other words, each time a mixed signal is filtered, sampled, and digitized, frequency decomposition circuit 150 determines the frequencies and the magnitudes of the frequencies that are present in the sample of the mixed signal. Frequency decomposition circuit 150 also evaluates each second digital value DV2 in the series of second digital values DV2, determines the frequencies and frequency magnitudes that are present in each second digital value DV2 (which is a digitized sample of a filtered version of mixed signal MS2), and outputs the frequencies and frequency magnitudes in each second digital value DV2 as a second data set DS2. Thus, frequency decomposition circuit 150 also receives the series of second digital values DV2, and outputs a series of second data sets DS2 in response where each second data set DS2 identifies the frequencies and frequency magnitudes that are present in a corresponding second digital value DV2.

In the present example, frequency decomposition circuit 150 is implemented as a fast Fourier transform. The fast Fourier transform converts each of the first digital values DV1 from a time-domain representation to a frequency-domain representation that identifies the frequencies and frequency magnitudes that are present in each first digital value DV1. The fast Fourier transform also converts each of the second digital values DV2 from a time-domain representation to a frequency-domain representation that identifies the frequencies and frequency magnitudes that are present in each second digital value DV2.

In addition, capacitance detection circuit 100 includes a memory 160, and a capacitance extractor 170 that is connected to frequency decomposition circuit 150 and memory 160. Memory 160 stores a number of first frequency-magnitude words and a change-in-capacitance value for each of the first frequency-magnitude words. Memory 160 also stores a number of second frequency-magnitude words and a change-in-capacitance value for each of the second frequency-magnitude words.

For example, memory 160 can have a column of first frequency-magnitude words, a column of associated change-in-capacitance values, and a number of rows where each row has a first frequency-magnitude word and an associated change value. Memory 160 can also have a column of second frequency-magnitude words, a column of associated change-in-capacitance values, and a number of rows where each row has a second frequency-magnitude word and an associated change value.

Capacitance extractor 170 has a number of first predefined frequencies, and determines a frequency magnitude for each first predefined frequency from each first data set DS1. For each predefined frequency, capacitance extractor 170 matches a predefined frequency to a frequency that is present in a first data set DS1, and then uses the magnitude associated with the frequency that is present in the first data set DS1 as the magnitude of the predefined frequency. In other words, the frequencies and the magnitudes of the frequencies that are present in a filtered, digitized sample of mixed signal MS1 are used to define the frequency magnitudes of a number of predefined frequencies.

For example, when the predefined frequencies include the frequencies 1.0 KHz, 1.2 KHz, 1.6 KHz, and 1.7 KHz, capacitance extractor 170 determines a magnitude value for the 1.0 KHz predefined frequency by using the magnitude value of a 1.0 KHz frequency that is present in a first data set DS1. Capacitance extractor 170 determines magnitude values for the remaining predefined frequencies in a similar manner. The magnitude value for each predefined frequency is then rounded to a value that ensures that the value will be present in memory 160.

Once capacitance extractor 170 has determined a magnitude value for each of the first predefined frequencies, capacitance extractor 170 creates an extracted frequency-magnitude word that includes each first predefined frequency, and defines the magnitude value of each first predefined frequency.

For example, a 32-bit word can be created where the first eight bits define the magnitude of the 1 KHz frequency, the second eight bits define the magnitude of the 1.2 KHz frequency, the third eight bits define the magnitude of the 1.6 KHz frequency, and, the fourth eight bits define the magnitude of the 1.7 KHz frequency.

Once the frequency-magnitude word has been formed, capacitance extractor 170 searches memory 160 to find a stored frequency-magnitude word entry that matches the extracted frequency-magnitude word created by capacitance extractor 170. After the matching frequency-magnitude word entry has been found, capacitance extractor 170 reads out from memory 160 the associated change-in-capacitance value, which identifies the change in the capacitance of variable capacitor C1 in VCO 110.

Capacitance extractor 170 has a number of second predefined frequencies, and determines a frequency magnitude for each second predefined frequency from each second data set DS2. For each predefined frequency, capacitance extractor 170 matches a predefined frequency to a frequency that is present in a second data set DS2, and then uses the magnitude associated with the frequency that is present in the second data set DS2 as the magnitude of the predefined frequency.

Once capacitance extractor 170 has determined a magnitude value for each of the second predefined frequencies, capacitance extractor 170 creates an extracted frequency-magnitude word that includes each second predefined frequency, and defines the magnitude value of each second predefined frequency.

After the frequency-magnitude word has been formed, capacitance extractor 170 searches memory 160 to find a stored frequency-magnitude word entry that matches the extracted frequency-magnitude word created by capacitance extractor 170. After the matching frequency-magnitude word entry has been found, capacitance extractor 170 reads out from memory 160 the associated change-in-capacitance value, which identifies the change in the capacitance of variable capacitor C2 in VCO 110.

When the capacitance is electrically changed, such as when a control signal is used to set or change the capacitance, the capacitance read from memory 160 can be fed back to verify that the desired capacitance is present. When the change in capacitance is changed by an external physical condition, the change in capacitance can be used to measure the change in the magnitude of the external physical condition, such as changes in acceleration or pressure.

One of the advantages of capacitance detection circuit 100 is that by utilizing the changing capacitance to vary the resonant frequency of a VCO, minute changes in capacitance can be detected. For example, in the context of an accelerometer, capacitance detection circuit 100 can be used to measure micro-g changes with a very high degree of accuracy.

The values stored in memory 160 can be experimentally determined. For example, the pressure can be changed from a first value to a second value and the frequency-magnitude word created in response by capacitance extractor 170 can then be read out. The frequency-magnitude word and the second pressure value can then be stored in memory 160. Similarly, the acceleration can be changed from a first value to a second value and the frequency-magnitude word created in response by capacitance extractor 170 can then be read out. The frequency-magnitude word and the second acceleration value can then be stored in memory 160.

The operations of frequency decomposition circuit 150 and capacitance extractor 170 can be performed by a digital signal processor. When a digital filter is used, the operations of the digital filter can also be performed by the digital signal processor. The digital signal processor can also include a memory which can be used to implement memory 160.

Figure 3:
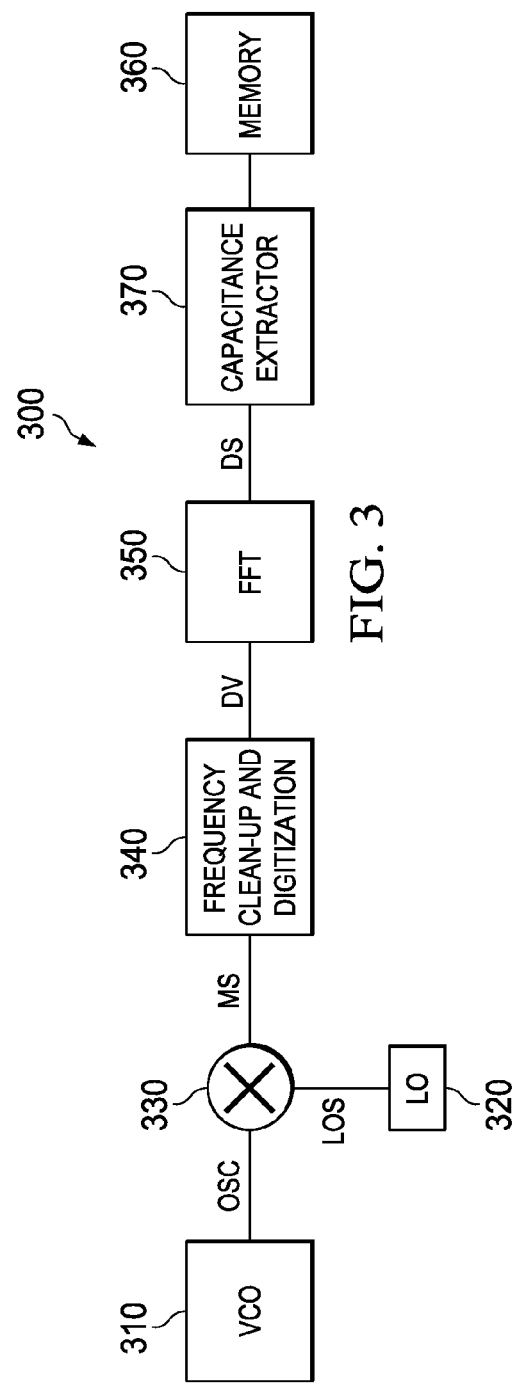
FIG. 3 is a block diagram illustrating an example of a capacitance detection circuit 300 in accordance with an alternate embodiment of the present invention.

FIG. 3 shows a block diagram that illustrates an example of a capacitance detection circuit 300 in accordance with the present invention. Capacitance detection circuit 300 is similar to capacitance detection circuit 100 except that capacitance detection circuit 300 has only a single channel rather than the two channels illustrated with capacitance detection circuit 100.

As shown in FIG. 3, capacitance detection circuit 300 includes a variable capacitance oscillator (VCO) 310 that generates an oscillator signal OSC. VCO 310 has an inductor and a variable capacitor that is connected to the inductor. The resonant frequency of the oscillator signal OSC changes in response to changes in the capacitance of the variable capacitor.

VCO 310 can be implemented with a number of conventional variable-capacitor based LC circuits. In the present example, the variable capacitor is formed within a MEMS integrated circuit as a sensor. Optionally, VCO 310 can be implemented with VCO 200 by using only one of the oscillator signals OSC1 and OSC2.

As further shown in FIG. 3, capacitance detection circuit 300 also includes a local oscillator (LO) 320 and a mixer 330 that is connected to VCO 310 and LO 320. LO 320 outputs a local oscillator signal LOS with a frequency that is equal to one of the resonant frequencies of the oscillator signal OSC.

In the present example, the frequency of the local oscillator signal LOS is equal to the resonant frequency of the oscillator signal OSC when the MEMS integrated circuit is stationary and the capacitance is constant. Mixer 130 mixes the oscillator signal OSC with the local oscillator signal LOS in a conventional manner, and generates a mixed signal MS in response.

As additionally shown in FIG. 3, capacitance detection circuit 300 includes a frequency clean-up and digitization circuit 340 that is connected to mixer 330. Frequency clean-up and digitization circuit 340 receives the mixed signal MS, and outputs a series of digital values DV that represent a portion of mixed signal MS.

Frequency clean-up and digitization circuit 340 can be implemented in a number of different ways. For example, if the f1-f2 down-converted frequency, the first harmonic of the f1-f2 down-converted frequency, and the frequencies between these frequencies are the only frequencies of interest in the mixed signal MS, then a conventional band pass filter can be utilized to remove the frequencies below the f1-f2 down-converted frequency, and above the first harmonic. A conventional A/D converter can next be used to digitize the output from the band pass filter. Alternately, the mixed signal MS can be digitized with a conventional A/D converter, and then filtered using a conventional digital filter to leave only the frequencies of interest.

As further shown in FIG. 3, capacitance detection circuit 300 includes a frequency decomposition circuit 350 that is connected to frequency clean-up and digitization circuit 340. Frequency decomposition circuit 350 evaluates each digital value DV in the series of digital values DV, determines the frequencies and frequency magnitudes that are present in each digital value DV (which is a digitized sample of a filtered version of mixed signal MS), and outputs the frequencies and frequency magnitudes in each digital value DV as a data set DS. Thus, frequency decomposition circuit 350 receives the series of digital values DV, and outputs a series of data sets DS in response where each data set DS identifies the frequencies and frequency magnitudes that are present in a corresponding digital value DV.

In the present example, frequency decomposition circuit 350 is implemented as a fast Fourier transform. The fast Fourier transform converts each of the series of digital values DV from a time-domain representation to a frequency-domain representation that identifies the frequencies and frequency magnitudes that are present in each digital value DV.

In addition, capacitance detection circuit 100 includes a memory 360, and a capacitance extractor 370 that is connected to frequency decomposition circuit 350 and memory 360. Memory 360 stores a number of frequency-magnitude words and a change-in-capacitance value for each of the frequency-magnitude words.

Capacitance extractor 370 also has a number of predefined frequencies, and determines a frequency magnitude for each predefined frequency from each data set DS. For each predefined frequency, capacitance extractor 170 matches a predefined frequency to a frequency that is present in a data set DS, and then uses the magnitude associated with the frequency that is present in the data set DS as the magnitude of the predefined frequency.

Once capacitance extractor 370 has determined a magnitude value for each of the predefined frequencies, capacitance extractor 370 creates an extracted frequency-magnitude word that defines the magnitude value for each predefined frequency. Once the frequency-magnitude word has been formed, capacitance extractor 370 searches memory 360 to find a stored frequency-magnitude word entry that matches the extracted frequency-magnitude word created by capacitance extractor 370. After the matching frequency-magnitude word entry has been found, capacitance extractor 370 reads out from memory 360 the associated change-in-capacitance value, which identifies the change in the capacitance of the variable capacitor in VCO 310.

Figure 4:
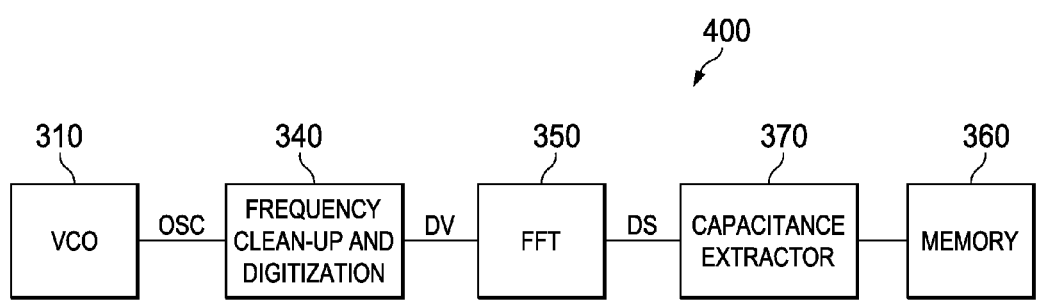
FIG. 4 is a block diagram illustrating an example of a capacitance detection circuit 400 in accordance with an alternate embodiment of the present invention.

FIG. 4 shows a block diagram that illustrates an example of a capacitance detection circuit 400 in accordance with the present invention. Capacitance detection circuit 400 is similar to capacitance detection circuit 300 and, as a result, utilizes the same reference numerals to designate the structures that are common to both circuits.

Capacitance detection circuit 400 differs from capacitance detection circuit 300 in that capacitance detection circuit 400 omits the local oscillator and the mixer. Otherwise, capacitance detection circuit 400 operates in the same manner as capacitance detection circuit 300.

Capacitance detection circuit 400 illustrates that the change in capacitance can be detected at the original frequency level, while capacitance detection circuits 100 and 300 illustrate that the change in capacitance can be detected at a baseband frequency level. Alternately, the frequency of the local oscillator signals LOS, LOS1, and LOS2 can be lowered so that the change in capacitance can be detected at an intermediate frequency level. For example, the frequency of the local oscillator signals LOS, LOS1, and LOS2 can be set to be 50 MHz less than the resonant frequencies of the oscillator signals OSC, OSC1, and OSC2 when the MEMS integrated circuit is stationary and the capacitance is constant.

Figure 5:
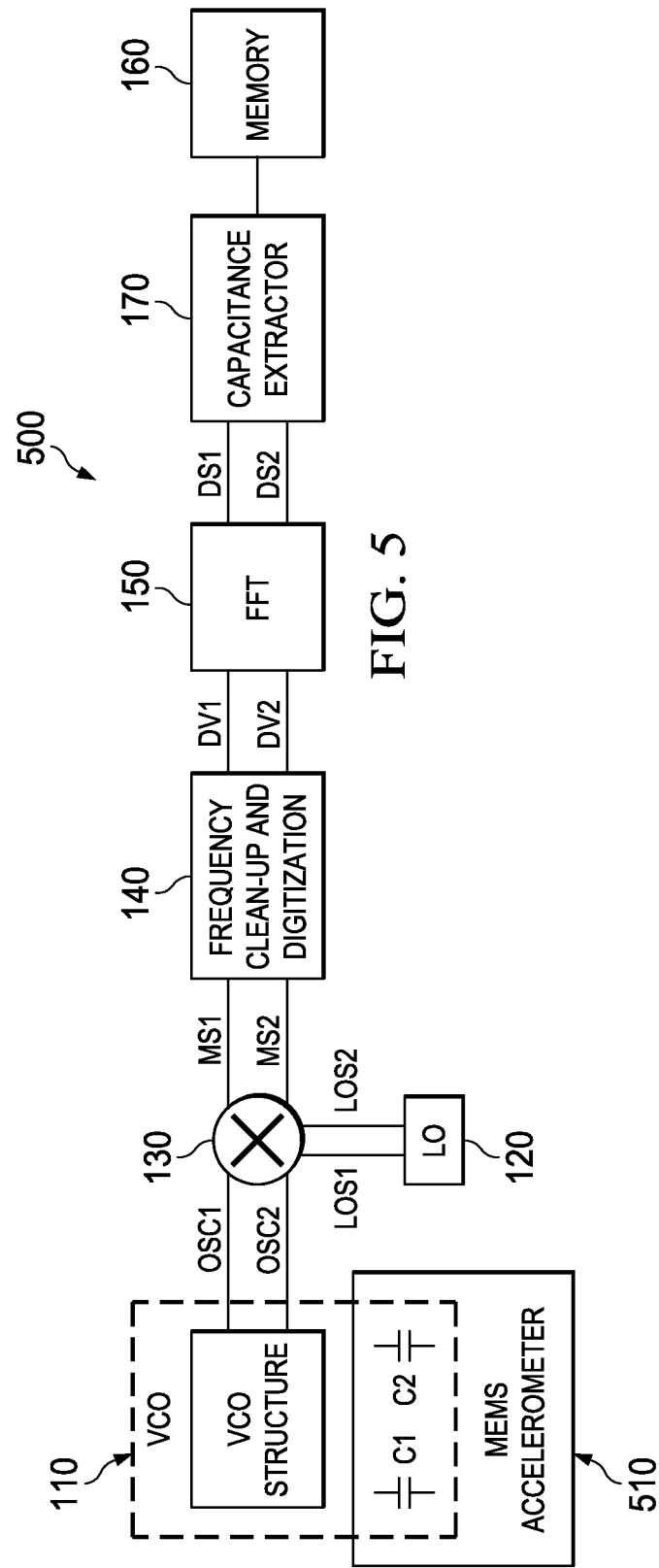
FIG. 5 is a block diagram illustrating an example of a capacitance detection circuit 500 in accordance with an alternate embodiment of the present invention.

FIG. 5 shows a block diagram that illustrates an example of a capacitance detection circuit 500 in accordance with an alternate embodiment of the present invention. Capacitance detection circuit 500 is similar to capacitance detection circuit 100 and, as a result, utilizes the same reference numerals to designate the structures which are common to both circuits.

As shown in FIG. 5, capacitance detection circuit 500 differs from capacitance detection circuit 100 in that capacitance detection circuit 500 includes a prior-art MEMS variable capacitance sensor 510 that provides the capacitors C1 and C2 that are used in VCO 200. Capacitance detection circuit 500 is an example of a real-world application where circuit 500 integrates a physical sensor, such as a MEMS accelerometer, and a VCO, such as VCO 200, into a single device that senses a physical condition, such as acceleration, by changes in the capacitances of capacitors C1 and C2, and generates oscillator signals OSC1 and OSC2 that vary in response to changes in the capacitances of capacitors C1 and C2.

It should be understood that the above descriptions are examples of the present invention, and that various alternatives of the invention described herein may be employed in practicing the invention. Thus, it is intended that the following claims define the scope of the invention and that structures and methods within the scope of these claims and their equivalents be covered thereby.

What is claimed is:

1. A capacitance-to-data converter (CDC) for use in a system identifying a change in the capacitance of the variable capacitor, the system including a frequency-domain capacitance extractor, the CDC comprising:
   a variable capacitance oscillator (VCO), including the variable capacitor, to generate a VCO oscillating signal with a frequency based on a VCO resonant frequency that is modulated based on changes in a capacitance of the variable capacitor;
   frequency digitization circuitry to receive the VCO oscillating signal, and generate time-domain digital samples that represent a portion of the VCO oscillating signal, including modulation based on the changes in capacitance; and
   a frequency decomposition module coupled to receive the time-domain digital samples generated by the frequency digitization circuitry, and;
   to convert these time-domain digital samples from the time domain to the frequency domain by generating corresponding frequency-domain information for each of these time-domain digital samples as a predetermined number of frequencies and frequency magnitudes;
   to output corresponding frequency-domain information for input to the frequency-domain capacitance extractor, the frequency-domain capacitance extractor having multiple predefined frequencies, and operable to determine for each predefined frequency, an extracted magnitude based on the frequency-domain information for that time-domain digital sample, the extracted magnitudes for the predefined frequencies corresponding to a change in the capacitance of the variable capacitor.

2. The CDC of claim 1 and further comprising:
   a local oscillator (LO) that outputs an LO oscillating signal having a LO frequency; and
   a mixer connected to the VCO and the LO, the mixer to generate an MS mixed oscillating signal by mixing the VCO signal with the LO signal, wherein the frequency digitization circuitry receives and operates on the MS signal.

3. The capacitance detection circuit of claim 2 wherein the frequency of the local oscillator signal is equal to the VCO resonant frequency when the capacitance of the variable capacitor is constant.

4. The CDC of claim 1, wherein the frequency-domain capacitance extractor is coupled to receive from the frequency decomposition module the frequency-domain information for respective time-domain digital samples, the frequency-domain capacitance extractor, further operable to:
create, for each of the respective time-domain digital samples, an extracted frequency-magnitude word with the determined extracted magnitudes, the extracted frequency-magnitude word corresponding to a change-in-capacitance value identifying a change in the capacitance of the variable capacitor in the VCO as represented by the frequency-domain information generated by the frequency decomposition unit.

5. The CDC of claim 4 wherein the frequency-domain capacitance extractor determines, for each of the respective time-domain digital samples, the extracted magnitudes for the extracted frequency-magnitude word by matching each of the predefined frequencies to a frequency that is present in the frequency-domain information for that time-domain digital sample, and then using a magnitude associated with the frequency that is present in the frequency-domain information for that time-domain digital sample as the extracted magnitude of the associated predefined frequency.

6. The CDC of claim 5, wherein:
the frequency-domain capacitance extractor includes a memory to store a number of pre-defined frequency-magnitude word entries and associated change-in-capacitance values;
the frequency-domain capacitance extractor, for a respective extracted frequency magnitude word, to read out from the memory the change-in-capacitance value that is associated with the stored frequency-magnitude word entry that matches the respective frequency magnitude word, the change-in-capacitance value identifying a change in the capacitance of the variable capacitor in the VCO.

7. A capacitance detection system comprising:
a capacitance-to-data converter (CDC), including:
a variable capacitance oscillator (VCO), including a variable capacitor, to generate a VCO oscillating signal with a frequency based on a VCO resonant frequency that is modulated based on changes in a capacitance of the variable capacitor, and
frequency digitization circuitry to receive the VCO signal, and generate time-domain digital samples that represent a portion of the VCO signal, including modulation based on changes in capacitance;
a frequency decomposition module coupled to receive time-domain digital samples generated by the frequency digitization circuitry, and to convert these time-domain digital samples from the time domain to the frequency domain by generating corresponding frequency-domain information for each of these time-domain digital samples as a corresponding number of frequencies and frequency magnitudes; and
a frequency-domain capacitance extractor coupled to receive from the frequency decomposition module the frequency-domain information for respective time-domain digital samples, the frequency-domain capacitance extractor operable to determine, for each predefined frequency, an extracted magnitude based on the frequency-domain information for that time-domain digital sample, the extracted magnitudes for the predefined frequencies corresponding to a change in the capacitance of the variable capacitor;
to extract from the associated extracted magnitudes a change-in-capacitance value identifying a change in the capacitance of the variable capacitor in the VCO; and
to output the change-in-capacitance value as representing a change in the capacitance of the variable capacitor in the VCO based on the frequency-domain information for the associated time-domain digital sample.

8. The capacitance detection system of claim 7 and further comprising:
a local oscillator (LO) that outputs an LO oscillating signal having a LO frequency; and
a mixer connected to the VCO and the LO, the mixer to generate an MS mixed oscillating signal by mixing the VCO signal with the LO signal,
wherein the frequency digitization circuitry receives and operates on the MS signal.

9. The capacitance detection circuit of claim 8 wherein the frequency of the LO signal is equal to the VCO resonant frequency when the capacitance of the variable capacitor is constant.

10. The capacitance detection system of claim 7
wherein the VCO generates first and second VCO signals, the VCO having first and second variable capacitors, the first VCO signal having a first VCO resonant frequency that is changeable by changing a capacitance of the first variable capacitor, the second VCO signal having a second VCO resonant frequency that is changeable by changing a capacitance of the second variable capacitor; and
wherein the frequency digitization circuitry receives the first and second VCO signals, and generates first and second time-domain digital samples that respectively represent a respective portion of the first and second VCO signals, including modulation based on changes in capacitance; and
wherein the frequency decomposition module is coupled to receive the first and second time-domain digital samples, and operable to convert these first and second time-domain digital samples from the time domain to the frequency domain by generating corresponding frequency-domain information for each of these time-domain digital samples.

11. The capacitance detection system of claim 7, wherein:
the frequency-domain capacitance extractor is operable:
to create for each of the respective time-domain digital samples, an extracted frequency-magnitude word with the determined extracted magnitudes;
to store in a memory a number of pre-defined frequency-magnitude word entries and an associated change-in-capacitance value, and
to extract capacitance by, for a respective extracted frequency magnitude word, by reading out from the memory the change-in-capacitance value that is associated with the stored frequency-magnitude word entry that matches the respective frequency magnitude word, the associated change-in-capacitance value identifying a change in the capacitance of the variable capacitor in the VCO.

12. The capacitance detection system of claim 11 wherein the frequency-domain capacitance extractor determines, for each of the respective time-domain digital samples, the extracted magnitudes for the extracted frequency-magnitude word by matching each of the predefined frequencies to a frequency that is present in the frequency-domain information for that time-domain digital sample, and then using a magnitude associated with the frequency that is present in the frequency-domain information for that time-domain digital sample as the magnitude of the associated predefined frequency.

13. A method suitable for detecting capacitance changes with a variable capacitance oscillator (VCO) including a variable capacitor, comprising:
   generating, a VCO oscillating signal based on a VCO resonant frequency that is modulated based on changes in a capacitance of the variable capacitor;
   generating time-domain digital samples that represent a portion of the VCO oscillating signal including modulation based on changes in capacitance; and
   converting these time-domain digital samples from the time domain to the frequency domain by generating corresponding frequency-domain information for each of these time-domain digital samples as a corresponding a number of frequencies and frequency magnitudes; and
   extracting capacitance by, for each time-domain digital sample,
   determining an extracted magnitude based on the frequency-domain information for that time-domain digital sample, the extracted magnitudes for the predefined frequencies corresponding to a change in the capacitance of the variable capacitor;
   extracting from the associated extracted magnitudes a change-in-capacitance value identifying a change in the capacitance of the variable capacitor in the VCO; and
   outputting the change-in-capacitance value as representing a change in the capacitance of the variable capacitor in the VCO based on the frequency-domain information for the associated time-domain digital sample.

14. The method of claim 13, wherein the VCO includes a local oscillator (LO) that outputs an LO oscillating signal having a LO frequency, and a mixer that generates an MS mixed oscillating signal by mixing the VCO signal with the LO signal, and wherein:
   the time-domain digital samples are generated using the MS signal.

15. The method of claim 14 wherein the frequency of the LO signal is equal to the VCO resonant frequency when the capacitance of the variable capacitor is constant.

16. The method of claim 13, wherein the extracting capacitance is accomplished by, for each time-domain digital sample:
   creating, for each of the respective time-domain digital samples, an extracted frequency magnitude word with the determined extracted magnitudes;
   storing in a memory a number of pre-defined frequency-magnitude word entries and an associated change-in-capacitance value,
   for a respective extracted frequency magnitude word, reading out the change-in-capacitance value that is associated with the stored frequency-magnitude word entry that matches the respective frequency magnitude word, and then
   outputting the associated change-in-capacitance value as representing a change in the capacitance of the variable capacitor in the VCO.

17. The method of claim 16 wherein:
   for each of the respective time-domain digital samples, the extracted magnitudes for the extracted frequency-magnitude word are determined by matching each of the predefined frequencies to a frequency that is present in the frequency-domain information for that time-domain digital sample, and then
   using a magnitude associated with the frequency that is present in the frequency-domain information for that time-domain digital sample as the magnitude of the associated predefined frequency.

18. The method of claim 13, wherein the VCO generates first and second VCO signals, the VCO having first and second variable capacitors, the first VCO signal having a first VCO resonant frequency that is changeable by changing a capacitance of the first variable capacitor, the second VCO signal having a second VCO resonant frequency that is changeable by changing a capacitance of the second variable capacitor, and wherein:
   first and second time-domain digital samples are generated for respectively the first and second VCO signals, including modulation based on changes in capacitance; and
   the first and second time-domain digital samples are converted from the time domain to the frequency domain by generating corresponding frequency-domain information for each of these first and second time-domain digital samples.

* * * * *

UNITED STATES PATENT AND TRADEMARK OFFICE
CERTIFICATE OF CORRECTION

PATENT NO. : 9,964,576 B2
APPLICATION NO. : 14/507665
DATED : May 8, 2018
INVENTOR(S) : Peyman Hojabri and Charles Yong Yi Guan Page 1 of 1

It is certified that error appears in the above-identified patent and that said Letters Patent is hereby corrected as shown below:

On the Title Page

(60) should be:
Provisional application No. 61/888,939, filed on Oct. 9, 2013.

Signed and Sealed this
Twentieth Day of November, 2018

Andrei Iancu
*Director of the United States Patent and Trademark Office*